United States Patent
Seong et al.

[11] Patent Number: 5,211,579
[45] Date of Patent: May 18, 1993

[54] BATTERY HOLDER

[75] Inventors: Au Y. C. Seong; Yuen P. Wong, both of Singapore, Singapore

[73] Assignee: Molex Incorporated, Lisle, Ill.

[21] Appl. No.: 884,492

[22] Filed: May 15, 1992

[51] Int. Cl.⁵ .............................................. H01R 3/00
[52] U.S. Cl. ........................................ 439/500; 439/698; 429/100
[58] Field of Search ............... 439/500, 621, 622, 627, 439/698, 830; 429/96, 97, 100

[56] References Cited

U.S. PATENT DOCUMENTS

| | | | |
|---|---|---|---|
| 1,896,813 | 2/1933 | Everett | 439/698 X |
| 2,293,354 | 8/1942 | Munchow | 439/500 X |
| 2,951,107 | 8/1960 | Abrams | 429/100 |
| 3,049,861 | 8/1962 | Jensen | 429/100 X |
| 3,181,974 | 5/1965 | Barbera | 429/100 |
| 4,623,206 | 11/1986 | Fuller . | |
| 5,007,859 | 4/1991 | Sangregory et al. | 439/500 |

OTHER PUBLICATIONS

Apple Computer, Inc. Drawing No. 517-1480-8.

Apple Computer Inc. Drawing No. 520-0344-A.

Primary Examiner—Larry I. Schwartz
Assistant Examiner—Khiem Nguyen
Attorney, Agent, or Firm—Charles S. Cohen

[57] ABSTRACT

A battery holder is disclosed which is of one piece construction and which includes a housing having a base and a pair of spaced end walls. One of the end walls is longer than the other and defines a recess therein which is configured to receive one end of the battery when the battery is inserted in the housing. A resilient terminal contact is provided at both ends of the housing and the terminal contact at the end opposite the recess is configured in a manner such that as the battery is being inserted in the housing the terminal contact is biased toward its end of the housing, and when the battery has been inserted into the housing the resilient terminal contact moves into overlying relationship with its end of the battery to hold that end of the battery against removal from the housing. In addition, terminal tails are provided on the terminal contacts which are kinked across their width to retain the connector on a circuit board prior to soldering.

12 Claims, 1 Drawing Sheet

U.S. Patent | May 18, 1993 | 5,211,579
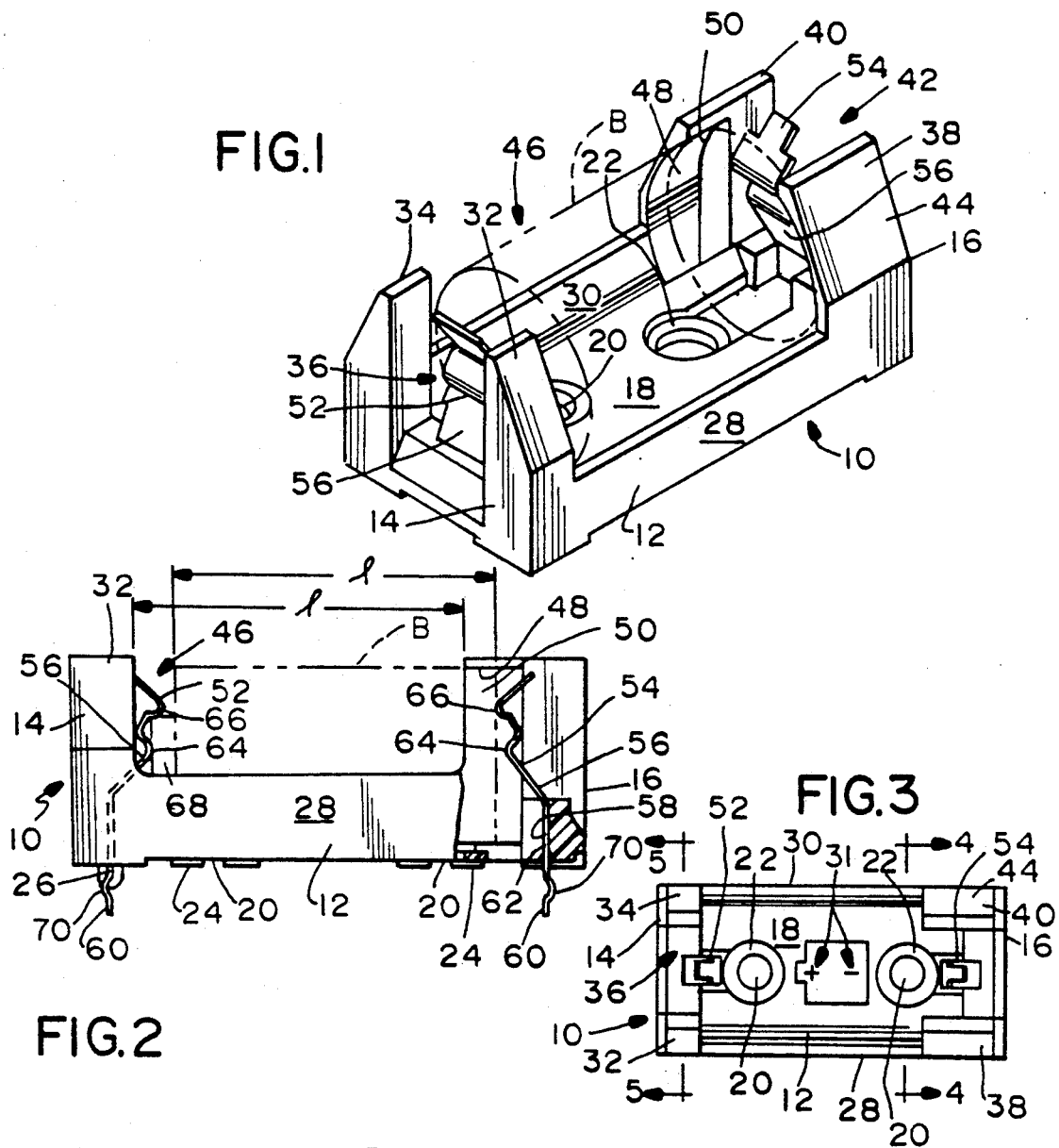
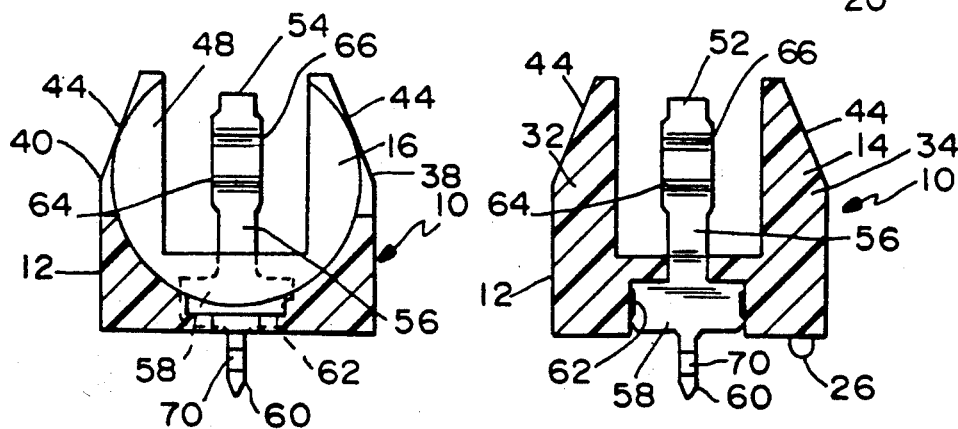

BATTERY HOLDER

BACKGROUND AND SUMMARY OF THE INVENTION

The present invention relates to a battery holder and, more particularly to a holder for a battery for attachment to a circuit board, for example, in a desk top computer.

Battery holders have been employed in the past for holding various forms of batteries, such as back up batteries for real time clocks in desk top computers. These batteries are typically ½ AA batteries and the battery holder is installed on the main or other circuit boards of the computer by terminal tails which are inserted into the circuit boards and soldered to the appropriate electrical circuit of the boards.

Prior battery holders have suffered several disadvantages. One disadvantage is that the holder has typically been of two piece construction, including a housing base in which the battery is inserted and a housing cover which snaps over the housing base to hold the battery in the housing base against removal. Because these holders are two piece, they are more complex to assemble, require the manufacture and inventory of both pieces which are of a different structural configuration from each other due to their distinct functions, consume more material in their manufacture and add weight to the installation in which they are installed.

Another disadvantage of the prior battery holders is that the terminal contact fingers for contacting the ends of the battery have generally not been configured to perform any battery holddown function, but simply bear against the battery ends to transmit current to the circuit board from the battery. Moreover, due to the configuration of the terminal contacts, any attempt to utilize the terminal contacts to retain the battery has resulted in the insertion of the battery in the housing being more difficult.

A battery holder incorporating the principles of the present invention overcomes these several disadvantages. A battery holder of the present invention eliminates the need for the housing cover and, thus, is one piece in construction so as to overcome most if not all of the aforementioned disadvantages of the prior two piece constructions. In a battery holder incorporating the principles of the present invention, insertion of the battery into the holder is simple and, once inserted, the battery is held against removal from the housing by the one piece housing itself and one or more of its terminal contacts, thus eliminating the need for the housing cover. Moreover, the force needed to insert the battery into the housing of the present invention is substantially reduced from those experienced in the prior art housings. Furthermore, once the battery has been installed in the housing, at least one of the terminal contacts not only functions to electrically couple the battery to its circuit as in the prior art, but also to latch an end of the battery against removal from the housing.

In one principal aspect of the present invention, a holder for holding a battery comprises a housing including an elongate base having a width, and also having a length the latter of which is longer than the length of the battery which is to be held. A pair of housing end walls are formed integrally with the base one at each end of the length of the base, the end walls extending upwardly from the base and spaced from each other so as to define an elongate space between the end walls which is at least about as long as the length of the battery which is to be held to permit insertion of the battery between the end walls. A portion of at least one of the end walls which faces the space has a recess which is configured to receive an end of the battery therein and overlie that end of the battery when the battery is inserted into the housing to hold the battery against removal from the housing. A pair of terminal contacts one adjacent each of the end walls is positioned for electrically contacting the ends of the battery when it is inserted in the housing, at least one of the contacts being resilient and positioned to resiliently bias the end of the battery into the recess in the one end wall. A terminal tail is electrically coupled to each of the terminal contacts and extends from and beneath the base to electrically couple the terminal contacts to a circuit board.

In another principal aspect of the present invention, each of the end walls comprises a pair of projections extending upwardly from the base and spaced from each other in the direction of the width of the base to define a space therebetween, and the terminal contacts are positioned adjacent that space between the projections.

In still another principal aspect of the present invention, the one end wall having the recess therein is longer in the direction of the length of the base than the length of the other end wall in that direction.

In still another principal aspect of the present invention, the one end wall having the recess therein is configured to receive the negative end of the battery to be held.

In still another principal aspect of the present invention, the resilient contact includes a latching projection which is positioned to be biased toward the end of the housing at which it is located by the battery as the battery is being inserted into the housing and to move into overlying relationship to at least a portion of the battery when the battery is fully inserted in the housing to hold the battery against removal from the housing.

In still another principal aspect of the present invention, the housing is one piece, and the recess and latching projection hold the respective ends of the battery when it is positioned in the housing against removal from the housing.

In still another principal aspect of the present invention, both of the terminal contacts are resilient.

In still another principal aspect of the present invention, the terminal tails are formed integrally with their respective terminal contacts.

These and other objects, features and advantages of the present invention will be more clearly understood through a consideration of the following detailed description.

BRIEF DESCRIPTION OF THE DRAWING

In the course of this description reference will frequently be made to the attached drawing in which:

FIG. 1 is an overall perspective view of a preferred embodiment of battery holder constructed in accordance with the principles of the present invention and showing a battery positioned therein in dot and dash;

FIG. 2 is a partially broken side elevation view of the battery holder substantially as shown in FIG. 1;

FIG. 3 is a plan view of the battery holder shown in FIG. 2;

FIG. 4 is a cross sectioned end elevation view of the battery holder, as viewed substantially along the lines 4—4 of FIG. 3; and FIG. 5 is a cross sectioned end elevation view of the battery holder, as viewed substantially along lines 5—5 of FIG. 3.

DESCRIPTION OF THE PREFERRED EMBODIMENT

As best seen in FIG. 1, a preferred embodiment of a battery holder constructed in accordance with the principles of the present invention comprises a one piece housing 10 which includes a generally rectangular elongate base 12 and a pair of end walls 14 and 16 at each end of the base and formed integrally therewith. The housing 10, including its base 12 and end walls 14 and 16, are preferably molded of a suitable nonconductive polymer, such as a polyester or other polymeric material as might commonly be used in the electronic connector industry.

The base 12 preferably comprises a floor 18 having one or more openings 20 therethrough for rivets or other suitable fastening means (not shown) for attachment of the housing to an electronic circuit board (also not shown). The surface of the floor 18 within the housing is preferably recessed at 22 around the perimeter of the openings 20 to accommodate the rivet or other fastener heads when the latter are inserted in the openings, and the openings 20 also may be reinforced on the underside of the floor by an annular flange 24 around the openings, as best seen in FIG. 2. In addition, the underside of the floor 18 may also include a molded positioning projection 26, as shown in FIGS. 2 and 5, to position the housing 10 on the circuit board to polarize the connector in the correct electrical orientation, i.e. positive to positive and negative to negative.

The upper surface of the floor 18 in the housing is preferably shaped in a concave cylindrical form which generally conforms to the shape of the battery B and which terminates at its side edges in a pair of side walls 28 and 30 which extend along the longer length of the base 12 and between the end walls 14 and 16. Thus, the battery B when inserted in the housing 10 is firmly cradled between the floor 18 and the side walls 28 and 30 along its length. The upper surface of the floor 18 may also have indicia 31 molded therein, as viewed in FIG. 3, to assist in the correct terminal orientation of the battery B during insertion.

The end wall 14 comprises a pair of upwardly extending projections 32 and 34 which are formed integrally with the base 12 and which are preferably spaced from each other in the direction of the width of the housing 10 to define a space 36 therebetween. The space 36 is preferably narrower in width than the width of the battery B so that the projections 32 and 34 act as an end stop for the battery when it is installed in the housing 10.

Likewise, the end wall 16 also comprises a pair of upwardly extending projections 38 and 40 which are formed integrally with the base 12 and are also spaced from each other in the direction of the width of the base to define a space 42 therebetween. The space 42 is also narrower in width than the width of the battery B for the aforementioned reason.

The tops of the projections 32, 34, 38 and 40 are preferably angled, for example at 44 as shown in the drawings, toward their tops to reduce the amount of material incorporated in the holder and its expense and weight, and also to minimize the volume consumed by the battery holder in the final installation. In addition, the end walls 14 and 16 are spaced from each other along the length of the housing 10 to define a space 46 which has a length 1 which is at least about equal to the length 1' of the battery as shown in FIG. 2, to permit insertion of the battery B through the space 46 and into the housing 10.

As shown in the drawings, the end wall 16 is preferably somewhat longer than the end wall 14 relative to the longitudinal direction of battery B and defines a recess 48 therein facing the space 46. The recess 48 is configured to receive an end of the battery B when the battery is inserted in the housing and overlies the battery end at 50, as best seen in FIGS. 1 and 2, to hold the battery in the housing against removal once the battery has been installed in the housing.

A pair of upstanding terminal contacts 52 and 54 are also positioned at each end of the housing 10 in the spaces 36 and 42 between the end wall projections 32, 34, 38 and 40. Each of the terminal contacts 52 and 54 is formed of a conductive material, such as metal, and is preferably resilient. Each of the terminal contacts 52 and 54 is also preferably formed in one piece construction and includes an upwardly extending arm 56, a cross arm 58 as best seen in FIGS. 2, 4 and 5, and a downwardly extending terminal tail 60 which extends from and beneath the bottom of the housing 10, also as best seen in FIGS. 2, 4 and 5. The cross arm 58 is configured to be press-fitted in a slot 62 in the base 12 adjacent each of the respective end walls, as best seen in FIGS. 2, 4 and 5, to hold the terminal contacts and position them in the housing.

The upwardly extending arms 56 of the terminal contacts 52 and 54 are preferably formed with two projections 64 and 66, as best seen in FIG. 2, with the upper projection 66 extending further into the housing than the lower projection 64. With these projections, it will be seen that when the battery B is being inserted in the housing 10, the positive terminal 68 of the battery B, as seen in FIG. 2, will first bias the projection 66 and the arm 56 of the terminal contact 52 away from the space 46 and toward the left end of the housing, as viewed in the drawing. Once the battery B has been fully inserted into the housing, the terminal contact 52 at the left of the housing will resiliently urge the battery to the right, as viewed in FIG. 2, so that the right end 50 of the battery will enter the recess 48 and be brought to electrically bear against the projection 66 on the terminal contact 54. Simultaneously, the projection 66 on the left terminal contact 52 will move into an overlying relationship with the battery terminal 68 to latch the left end of the battery to resist removal upwardly from the housing and to electrically contact, together with projection 64, the battery terminal 68. Thus, terminal contact 52 not only serves the function of electrically coupling the battery B, but also functions to force the negative right end 50 of the battery into the holddown recess 48, and to latch the other left end of the battery and its positive terminal 68 against upward removal from the housing. It has also been found that the higher elevation location of the latching projection 66 and the configuration of the terminal contact 52 facilitates the ease of insertion of the battery B into the housing 10.

The terminal tails 60 also preferably include a kink 70 intermediate their length and across their width, as shown in FIGS. 2, 4, and 5. Such kinked or bent portions act as compliant boardlocks to retain the connector to the circuit board prior to soldering of the terminals.

From the consideration of the foregoing description of the preferred embodiment of the present invention, it will be appreciated that the battery holder of the present invention is capable of effectively retaining a battery while utilizing only a simple, lighter and less expensive one piece holder construction, and the battery once it is inserted in the housing is held against removal by the positioning of one end of the battery B in the recess 48 and the other end of the battery is latched against removal by the overlying terminal contact projection 66 on the terminal contact 52, as best seen in FIG. 2. Moreover, it will also be seen that insertion of the battery B into the housing 10 is facilitated due to the configuration as above described of the terminal contact arms 56.

The battery holder of the present invention may, for example, be used for holding a battery, such as a ½ AA 3.6 v. lithium cell battery, in a circuit board of a table top computer as a back up battery for the real time clock. However, it will be understood that the use of the holder of the invention is not so limited.

It also will be understood that the embodiment of the present invention which has been described is merely illustrative of an application of the principles of the present invention. Numerous modifications may be made by those skilled in the art without departing from the spirit and scope of the present invention.

What is claimed is:

1. A holder for holding a battery therein comprising:
   a housing including an elongate base having a width, and also having a length the latter of which is longer than the length of the battery which is to be held;
   a pair of housing end walls formed integrally with said base one at each end of the length of said base, said end walls extending upwardly from said base and spaced from each other so as to define an elongate space between said end walls which is at least about as long as the length of the battery which is to be held to permit insertion of the battery between the end walls;
   a portion of at least one of said end walls which faces said space having a recess which is configured to receive an end of the battery therein and overlie that end of the battery when the battery is inserted into said housing to hold the battery against removal from said housing;
   a pair of terminal contacts one adjacent each of said end walls for electrically contacting the ends of the battery when it is inserted in said housing, at least one of said contacts being resilient and positioned to resiliently bias the end of the battery into said recess in said one end wall, said resilient contact including a latching projection which is positioned to be biased toward the end of the housing at which it is located by the battery as the battery is being inserted in said housing, and to move into overlying relationship to at least a portion of the battery when the battery is fully inserted in the housing to hold the battery against removal from said housing and a second projection between said latching projection and said base which resiliently biases the battery into said recess, said latching projection exerting a force toward said base to retain the battery in the housing; and
   a terminal tail electrically coupled to each of said terminal contacts and extending from and beneath said base to electrically couple said terminal contacts to a circuit board.

2. The holder of claim 1, wherein each of said end walls comprises a pair of projections extending upwardly from said base and spaced from each other in the direction of the width of said base to define a space therebetween, said terminal contacts being positioned adjacent said space between said projections.

3. The holder of claim 1, wherein said one end wall having said recess therein is longer in the direction of the length of said base than the length of the other end wall in said direction.

4. The holder of claim 3, wherein said one end wall having said recess therein is configured to receive the negative end of the battery to be held.

5. The holder of claim 1, wherein said one end wall having said recess therein is configured to receive the negative end of the battery to be held.

6. The holder of claim 1, wherein said housing is one piece, and said recess and latching projection hold the respective ends of the battery when it is positioned in the housing against removal from the housing.

7. The holder of claim 1, wherein both of said terminal contacts are resilient.

8. The holder of claim 1, wherein said terminal tails are formed integrally with their respective terminal contacts.

9. The holder of claim 8, wherein said terminal tails include compliant portions intermediate their length beneath said base.

10. A holder for holding a battery therein comprising:
    a one piece housing including an elongate base having a width, and also having a length the latter of which is longer than the length of the battery which is to be held;
    a pair of housing end walls formed integrally with said base one at each end of the length of said base, said end walls extending upwardly from said base and spaced from each other so as to define an elongate space between said end walls which is at least about as long as the length of the battery which to be held to permit insertion of the battery between the end walls;
    a portion of at least one of said end walls which faces said space having a recess which is configured to receive an end of the battery therein and overlie that end of the battery when the battery is inserted into said housing to hold the battery against removal from said housing;
    a pair of terminal contacts one adjacent each of said end walls for electrically contacting the ends of the battery when it is inserted in said housing, at least one of said contacts being resilient and positioned to resiliently bias the end of the battery into said recess in said one end wall, said resilient contact includes a latching projection which is positioned to be biased toward the end of the housing at which it is located by the battery as the battery is being inserted in said housing, and to move into overlying relationship to at least a portion of the battery when the battery is fully inserted in the housing to hold the other end of the battery against removal from said housing and a second projection between said latching projection and said base which resiliently biases the battery into said recess, said latching projection exerting a force toward said base to retain the battery in the housing;

each of said end walls comprises a pair of projections extending upwardly from said base and spaced from each other in the direction of the width of said base to define a space therebetween, said terminal contacts being positioned adjacent said space between said projections; said one end wall having said recess therein is longer in the direction of the length of said base than the length of the other end wall in said direction; and a terminal tail electrically coupled to each of said terminal contacts and extending from and beneath said base to electrically couple said terminal contacts to a circuit board.

11. A The holder of claim 10, wherein said terminal tails are formed integrally with their respective terminal contacts.

12. The holder of claim 11, wherein said terminal tails include compliant portions intermediate their length beneath said base.

* * * * *